United States Patent [19]

Lee et al.

[11] Patent Number: 5,777,934
[45] Date of Patent: Jul. 7, 1998

[54] SEMICONDUCTOR MEMORY DEVICE WITH VARIABLE PLATE VOLTAGE GENERATOR

[75] Inventors: Sang-bo Lee; Dong-il Seo, both of Kyungki-do, Rep. of Korea

[73] Assignee: Samsung Electronics Co., Ltd., Suwon, Rep. of Korea

[21] Appl. No.: 674,705

[22] Filed: Jul. 8, 1996

[30] Foreign Application Priority Data

Jul. 7, 1995 [KR] Rep. of Korea .......... 95-19993

[51] Int. Cl.$^6$ .......................................... G11C 8/00
[52] U.S. Cl. ....................... 365/203; 365/149; 365/189.09
[58] Field of Search ........................... 365/194, 149, 365/203, 189.09

[56] References Cited

U.S. PATENT DOCUMENTS

| | | | |
|---|---|---|---|
| 4,725,985 | 2/1988 | Ogura et al. | 365/201 |
| 5,404,325 | 4/1995 | Shibata | 365/149 |
| 5,469,395 | 11/1995 | Kuwabara et al. | 365/207 |
| 5,524,093 | 6/1996 | Kuroda | 365/145 |
| 5,555,526 | 9/1996 | Kim | 365/203 |

*Primary Examiner*—David C. Nelms
*Assistant Examiner*—Hien Nguyen
*Attorney, Agent, or Firm*—Marger, Johnson, McCollom & Stolowitz, P.C.

[57] ABSTRACT

A semiconductor memory device achieves high speed operation while operating at a low power supply voltage by boosting the voltage level at the plate node of a memory cell during an access operation. The memory device includes a plate voltage generator which generates a variable voltage level. The plate voltage generator includes a pair of switches for coupling the plate node to either a conventional (½)VCC voltage generator or a power supply node in response to a control signal. The plate voltage generator also includes a pulse generator that generates a pulse signal for controlling the switches in response to the control signal. During a precharge period, the bitline pair is charged to VCC. The plate voltage generator charges the plate node to (½)VCC during the precharge state and then to VCC during an access operation. This boosts the voltage level at the storage node of the memory cell, thereby decreasing the time required to amplify the signals on the bitlines.

21 Claims, 3 Drawing Sheets

SEMICONDUCTOR MEMORY DEVICE WITH VARIABLE PLATE VOLTAGE GENERATOR

BACKGROUND OF THE INVENTION

1. Field of the Invention

This invention relates generally to semiconductor memory devices and more particularly to a memory device having a plate voltage generator that is capable of supplying a variable voltage level.

This application corresponds to Korean Patent application No. 95-19993 filed Jul. 7, 1995 in the name of Samsung Electronics Co., Ltd., which is hereby incorporated by reference.

2. Description of the Related Art

As the density of semiconductor memory devices increases, they are being operated at lower power supply voltages. However, using a low supply voltage causes the operating speed of a memory device to decrease. In general, the threshold voltage of the MOS transistors used in a memory device can be reduced to achieve higher speed operation. However, reducing the threshold voltage results in increased power consumption due to leakage current in the transistors. Therefore, a compromise must be made between operating speed and power consumption when selecting the supply voltage and the threshold voltage of the transistors used in a memory device.

Further, when a low supply voltage is used with a conventional memory device in which ½ of the supply voltage ((½)VCC) is supplied to the plate node of each memory cell, the sensing speed must be reduced or there will be a high probability of obtaining erroneous results from the sensing operation performed by the bitline sense amplifier circuit. Although the probability of erroneous data decreases when the supply voltage is relatively high, for example, 3.3 or 5 volts, lower supply voltages must be used in order to increase the integration density of semiconductor memory devices. Thus, there is a need for a technique for obtaining precise, high-speed sensing in a memory device operating from a low supply voltage.

Various circuits have been developed for precharging bitline pairs to a voltage level of (⅔)VCC or VCC. However, when precharging the bitline pair to (⅔)VCC, the sensing margin is higher when "high" data is stored in the memory cell than when "low" data is stored. This irregularity in the sensing margin results in a higher probability of erroneous results from the sense operation. Also, when precharging the bitline pair to (⅔)VCC, a dummy cell having a capacity of about ⅓ the capacity of a general memory cell is used to read "high" data. However, using a dummy cell is undesirable since it increases the chip size and causes a reduction of the charge sharing voltage.

Accordingly, a need remains for a semiconductor memory device that overcomes the problems discussed above.

SUMMARY OF THE INVENTION

It is, therefore, an object of the invention to operate a semiconductor memory device at a low power supply voltage while still maintaining high speed operation.

A semiconductor memory device according to the present invention achieves high speed operation while operating at a low power supply voltage by boosting the voltage level at the plate node of a memory cell during an access operation, thereby decreasing the time required to sense and amplify the signals on the bitlines.

One aspect of the present invention is a semiconductor memory device comprising a memory cell having a plate node, and a plate voltage generator coupled to the plate node. The plate voltage generator generates a first voltage signal at the plate node during a precharge operation and a second voltage signal at the plate node during an access operation.

The plate voltage generator includes first and second voltage generators, and first and second switches coupled between the plate node and the first voltage generator and between the plate node and the second voltage generator. The plate voltage generator further includes a pulse generator coupled to the first and second switches for generating a pulse signal for controlling the switches responsive to a control signal.

Another aspect of the present invention is a method for sensing the logic level of a semiconductor memory cell having a bit line, a plate node, a storage node, and a capacitor coupled between the plate node and the storage node. The method comprises: charging the bit line to a precharge voltage level; charging the plate node to a first voltage level; charging the plate node to a second voltage level, thereby boosting the voltage level at the storage node; coupling the storage node to the bit line, thereby redistributing charge from the capacitor between the capacitor and the bit line; and sensing the voltage level of the bit line.

Charging the plate node to the first voltage level can be achieved by coupling the plate node to a first voltage generator, and charging the plate node to the second voltage level can be achieved by coupling the plate node to a second voltage generator.

After the plate node is charge to the second voltage level and before the storage node is coupled to the bit line, the magnitude of the voltage difference between the storage node and the bit line is substantially the same when the data stored in the memory cell is a high logic level as when the data stored in the memory cell is a low logic level.

The foregoing and other objects, features and advantages of the invention will become more readily apparent from the following detailed description of a preferred embodiment of the invention which proceeds with reference to the accompanying drawings.

DETAILED DESCRIPTION

Figure 1:
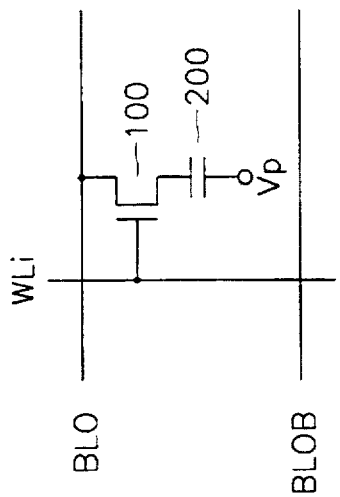
FIG. 1 is a schematic diagram of a prior art semiconductor memory cell.

FIG. 1 is a circuit diagram showing a prior art general DRAM memory cell which includes a storage capacitor 200 and an access transistor 100 for controlling the input and output of data information stored in the storage capacitor 200.

Referring to FIG. 1, one terminal of an access transistor 100 is connected to a bitline BL0 and the other terminal thereof is connected to one terminal of a storage capacitor 200. The gate of the access transistor 100 is connected to a wordline (WLi). The node at which the access transistor 100 and the storage capacitor 200 are connected is generally called a storage node. The plate voltage $V_p$ which is generated by a plate voltage generating circuit is supplied to the other terminal of the storage capacitor, which is generally called a plate node.

Figure 2:
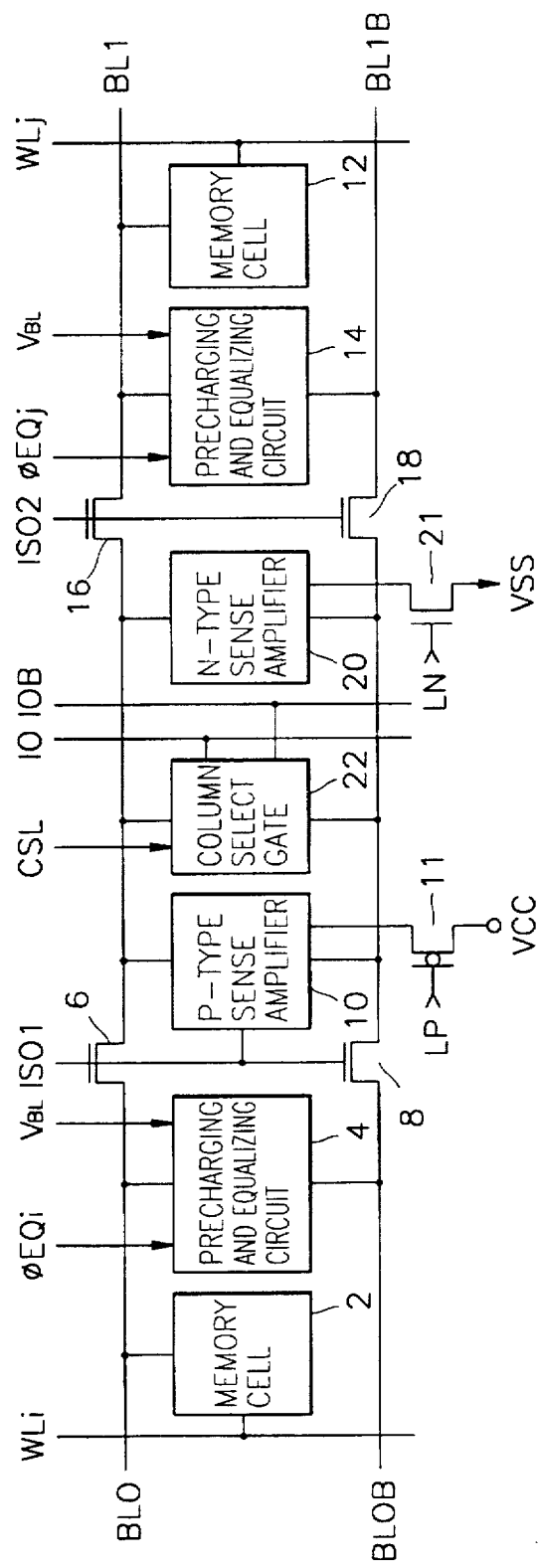
FIG. 2 is a schematic diagram of a core of a prior art semiconductor memory including the memory cell of FIG. 1.

FIG. 2 shows the construction of the core portion of a prior art semiconductor memory device including the DRAM memory cell shown in FIG. 1.

Referring to FIG. 2, a memory cell 2 is connected to the wordline WLi and bitline BL0, and a precharging and equalizing circuit 4 is connected between BL0 and BL0B. Another memory cell 12 is connected to a wordline WLj and a bitline BL1, and a precharging and equalizing circuit 14 is connected between BL1 and BL1B.

The control electrodes of isolation gates 6 and 8 are connected to a first isolation gate control signal ISO1 and one terminal of each isolation gate 6 and 8 is connected to BL0 and BL0B, respectively. The control electrodes of isolation gates 16 and 18 are connected to a second isolation gate control signal ISO2 and one terminal of each isolation gate 16 and 18 is connected to the bitline pair BL1 and BL1B. The other terminals of isolation gates 6 and 8 are connected to the other terminals of isolation gates 16 and 18, respectively.

A P-type sense amplifier 10, an N-type sense amplifier 20, and a column select gate 22 are connected in parallel between a first connection line formed between the isolation gates 6 and 16 and a second connection line formed between the isolation gates 8 and 18. The column select gate 22 is further connected to input/output lines IO and IOB. A PMOS driver 11 having a gate connected to a signal LP is connected between the P-type sense amplifier 10 and a supply voltage VCC. An NMOS driver 21 having a gate connected to a signal LN is connected between the N-type sense amplifier 20 and ground VSS. The sense amplifier circuit, which is referred to as a shared P-N sense amplifier, is designed to share an adjacent memory cell array.

In operation, the bitlines BL0, BL0B, BL1, and BL1B are precharged to a voltage level of (½)VCC by the precharging and equalizing circuits 4 and 14 when the device is in an inactive state. In an active state in which a word line WLi is selected by a row decoder (not shown), a charge sharing operation is performed wherein the charge stored in the capacitor the memory cell 2 is distributed between the capacitor and the parasitic capacitance of the bitline BL0. Thus, a voltage difference of up to a few hundred millivolts is generated between the bitline pair BL0 and BL0B.

Next, the first isolation gate control signal ISO1 transmits a boosting voltage level to the control electrodes of the isolation gates 6 and 8. The second isolation gate control signal ISO2 transmits a low logic level to the control electrodes of the isolation gates 16 and 18. Thus, isolation gates 6 and 8 are turned on and isolation gates 16 and 18 are turned off. Then, the voltages of the bitline pair BL0 and BL0B are sensed by the P-type sense amplifier 10 and the N-type sense amplifier 20 and amplified to voltage levels of VCC and VSS. Then, the amplified voltage signals are coupled to the input/output lines IO and IOB via the column select gate 22 and transmitted to the outside of the chip through output circuits which are not shown.

A more detailed description of the composition and operation of the components comprising the prior art circuit of FIG. 2 can be found in various theses, scientific journals, and patent applications.

Figure 3:
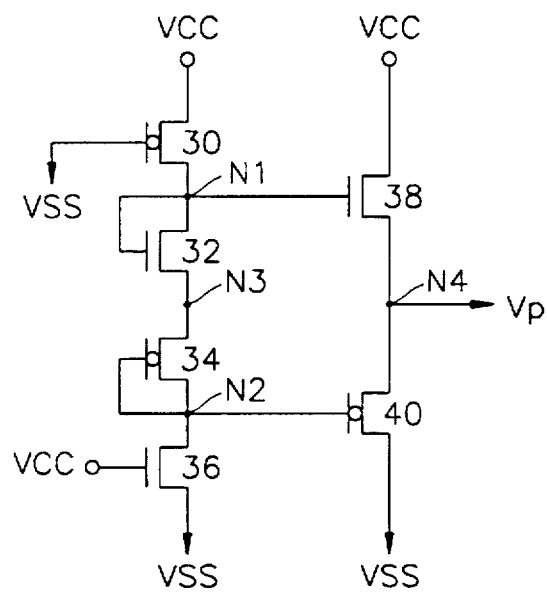
FIG. 3 is a schematic diagram of a prior art plate voltage generator.

FIG. 3 shows a prior art plate voltage generating circuit for supplying the plate voltage to the plate node of the storage capacitor 200 comprising the memory cell of FIG. 1.

Referring to FIG. 3, a PMOS transistor 30, an NMOS transistor 32, a PMOS transistor 34, and an NMOS transistor 36 are connected in series between the supply VCC and ground VSS. The gate, source, and drain of transistor 30 are connected to VSS, VCC, and the drain of transistor 32, respectively. The gate of transistor 32 is connected back to its drain, and the source is connected to the source of transistor 34. The gate of transistor 34 is connected back to its drain which is also connected to the drain of transistor 36. The gate and source of transistor 36 are connected to VCC and VSS, respectively.

An NMOS transistor 38 and a PMOS transistor 40 are connected in series between VCC and VSS. The gate of transistor 38 is connected to a node N1 at the drain of transistor 32, the drain of transistor 38 is connected to VCC, and the source of transistor 38 is connected to the source of transistor 40 at node N4. The gate of transistor 40 is connected to a node N2 at the drain of transistor 34, and the drain of transistor 40 is connected to VSS. The voltage generating circuit generates the plate voltage $V_p$ at node N4.

In operation, transistors 30 and 36 are always turned on since their gates are connected to ground VSS and the supply voltage VCC respectively. Therefore, nodes N1 and N2 are at the voltage levels VCC–Vtp and Vtn, respectively, where Vtp is the threshold voltage of the PMOS transistor 30 and Vtn is that of the NMOS transistor 36. Thus, transistors 32 and 34 are turned on since their gates are connected to nodes N1 and N2, respectively, and the voltage of node N3 is charged to a predetermined level which is generally (½)VCC. Since the gates of transistors 38 and 40 are also connected to nodes N1 and N2, respectively, transistors 38 and 40 are also turned on, so that the voltage of node N4 is charged to the voltage level corresponding to that of node N3, which becomes the plate voltage $V_p$. Therefore, the plate voltage $V_p$ is (½)VCC.

When a semiconductor memory device as described in FIGS. 1–3 is operated at a low supply voltage, the sensing speed of the bitline sense amplifier circuit must be decreased or there will be a high probability of obtaining erroneous results from the sensing operation.

Figure 4:
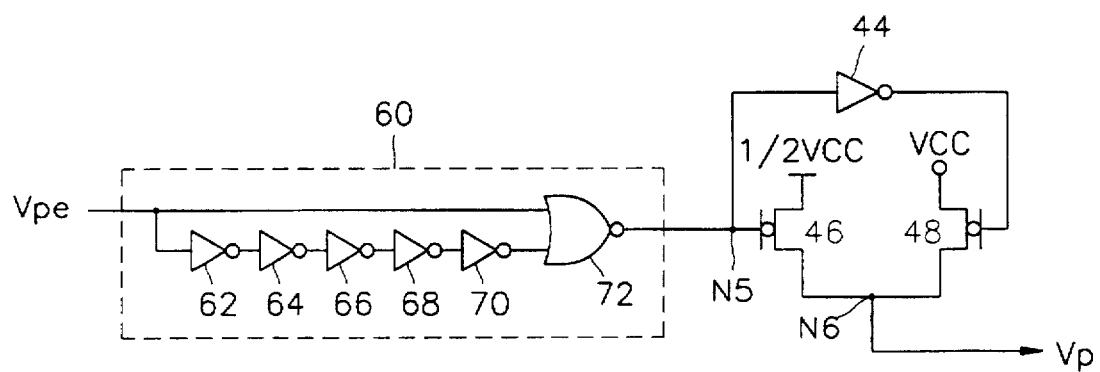
FIG. 4 is a schematic diagram of an embodiment of a plate voltage generator in accordance with the present invention.

FIG. 4 is a schematic diagram of an embodiment of a plate voltage generator in accordance with the present invention. Prior to describing the detailed structure of the generator of FIG. 4, the key components of the invention will be identified followed by a brief description of the operation of the system. Then a more detailed description of each of the components will be provided along with a more detailed description of the operation.

Referring to FIG. 4, a plate voltage generator in accordance with the present invention includes two switches 46 and 48 for connecting an output line 50 to a power supply node VCC and the output node of a (½)VCC voltage generator, respectively. The switches are controlled by a pulse generator 60 which generates a pulse signal having a predetermined length in response to a control signal Vpe.

When the output line 50 is connected to the plate node $V_p$ of a memory cell as shown in FIGS. 1 and 2, the plate voltage generator of FIG. 4 operates as follows. First, bitlines BL0 and BL0B are charged to a precharge voltage level of VCC during a precharge period. During the precharge period, the control signal Vpe is at a high logic level which causes the pulse signal to remain at a low logic level. Thus, switch 46 is on and connects the plate node Vp to the (½)VCC voltage generator which charges the plate node to a voltage level of (½)VCC.

Then, during an access operation, the control signal switches to the low logic level causing the pulse generator to switch the pulse signal to the high logic level which causes switch 46 to turn off and switch 48 to connect the plate node to the power supply node VCC. This charges the plate node to a voltage level of VCC, thereby forcibly boosting the voltage level at the storage node of the capacitor 200 of FIG. 1. The storage node is then coupled to the bit line through transistor 100 which causes the charge stored in the capacitor to be redistributed between the capacitor and the parasitic capacitance of the bitline. The voltages of the bitline pair are then sensed and amplified by sense amplifiers.

More detailed consideration will now be given to the structure of a plate voltage generator according to the present invention. Referring to FIG. 4, one switch is formed by a PMOS transistor 46 which has a source terminal connected to the output node of a (½)VCC generator such as the plate voltage generator shown in FIG. 3. The drain of transistor 46 is connected to an output line 50 at node N6. Another switch is formed by a PMOS transistor 48 which has a source connected to a power supply node VCC, and a drain coupled to the output line 50 at node N6. The output line 50 is typically connected to the plate node of a memory cell such as the cell shown in FIGS. 1 and 2. The gate of transistor 46 forms a node N5 and is connected to the input port of an inverter 44, while the gate of transistor 48 is connected to the output port of inverter 44. Thus, when a high logic level signal is applied to node N5, transistor 46 is turned on and transistor 48 is turned off. When a low logic level signal is applied to node N5, transistor 46 is turned off and transistor 48 is turned on.

The pulse generator 60 includes a NOR gate 72 having an output port connected to node N5 and one input port connected to a control node Vpe. The pulse generator also includes five inverters 62, 64, 66, 68, and 70 connected together in series with the output port of each inverter connected to the input port of the next inverter to form a delay line. The input port of the first inverter 62 is connected to the control node Vpe, while the output port of the last inverter 70 is connected to the other input port of the NOR gate 72.

More detailed consideration will now be given to the operation of the present invention with reference to FIG. 4. During the precharge period, the bitlines BL0 and BL0B are charged to the power supply voltage level VCC. Also during the precharge state, the control signal Vpe is at a high logic level which causes the pulse generator 60 to drive node N5 to a low logic level. Thus, transistor 48 is turned off, while transistor 46 is turned on, thereby coupling the plate node Vp to the output node of a voltage generator such as the (½)VCC plate voltage generator shown in FIG. 3. This charges the plate node to a voltage level of (½)VCC.

During an access operation, the control signal Vpe changes to a low logic level which causes the pulse generator 60 to drive node N5 high for a predetermined time due to the propagation delay through the inverters 62–70. This causes transistor 46 to turn off and transistor 48 to turn on, thereby coupling the plate node to the power supply node VCC. Thus, the plate node is charged to a voltage level of VCC. This, in turn, boosts the voltage at the storage node of a memory cell such as that shown in FIG. 1 from 0 volts to (½)VCC if the data stored in the memory cell is at a low logic level, and from (½)VCC to (3/2)VCC if the data stored in the memory cell is at a high logic level. Therefore, after the voltage level of the plate node is boosted to the second voltage level, the magnitude of the voltage difference between the storage node and the bit lines is substantially the same regardless of the logic state of the data stored in the cell.

The storage node is then coupled to the bit line BL0 through transistor 100 which causes the charge stored in the capacitor to be redistributed between the capacitor and the parasitic capacitance of the bitline BL0. The voltages of the bitline pair BL0 and BL0B are then sensed and amplified by sense amplifiers such as amplifiers 10 and 20 as shown in FIG. 2. The amplified signals are then coupled to I/O lines which transfer the signals outside of the memory device.

Figure 5A:
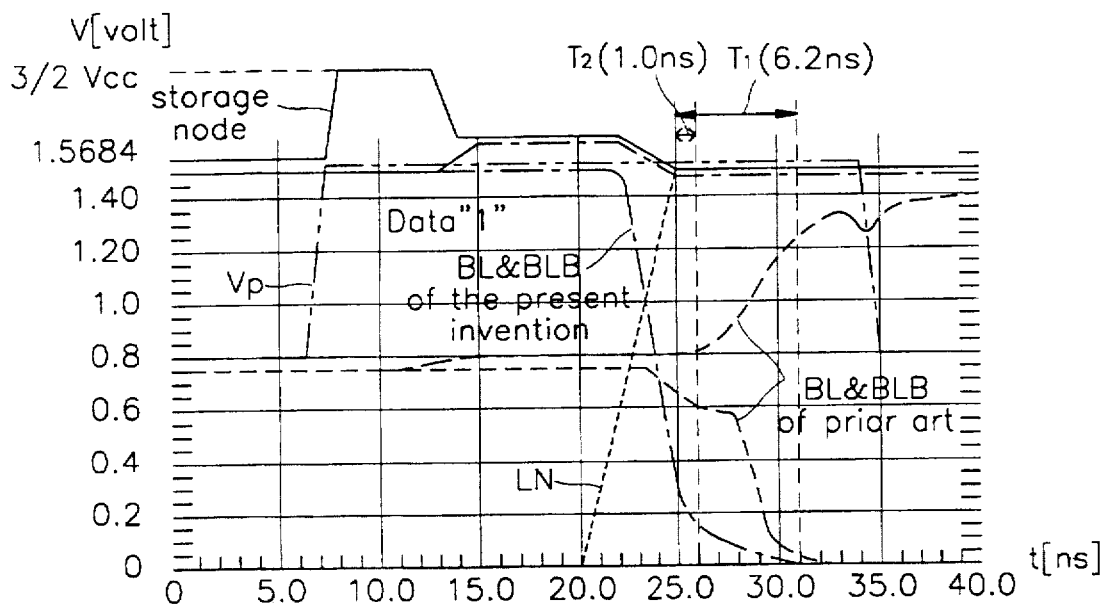
FIGS. 5A and 5B are diagrams showing voltage waveforms at various nodes in a semiconductor memory in accordance with the present invention and in a prior art semiconductor memory.
Figure 5B:
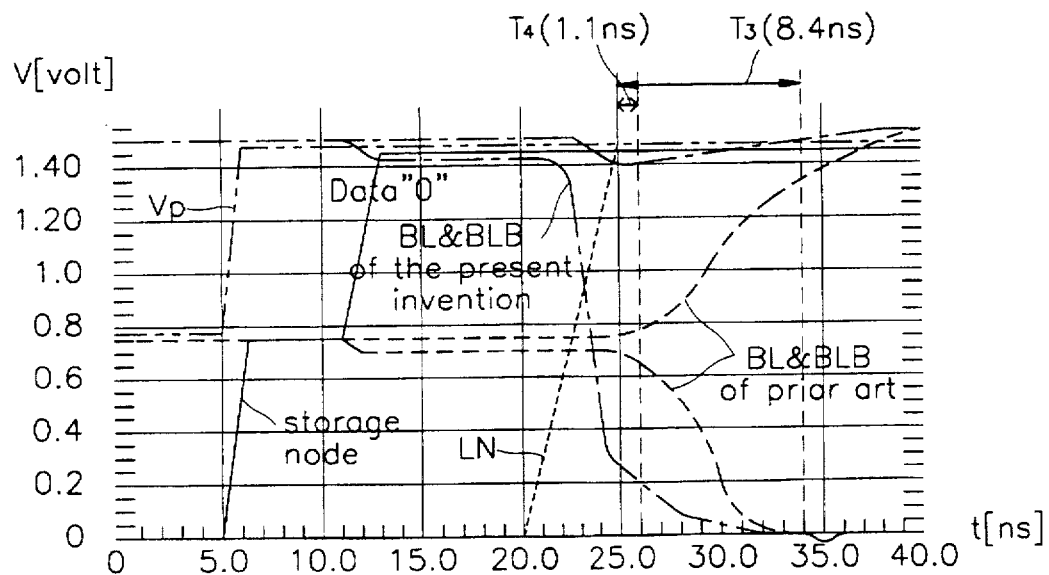

FIGS. 5A and 5B are diagrams showing waveforms of the voltage signals at various nodes of a semiconductor memory device having an embodiment of a variable plate voltage generator according to the preset invention. Waveforms from a prior art memory device are shown for comparison. FIG. 5A shows waveforms obtained when high logic data is stored in a memory cell, while FIG. 5B shows waveforms obtained when low logic data is stored. The waveforms are representative of signals obtained under experimental conditions in which the capacitance of the bitline pair is 200 femtofarads and that of the storage capacitor of the memory cell is 30 femtofarads.

As shown in FIGS. 5A and 5B, a memory device according to the present invention shows sharply increased sensing speeds compared to the prior art. In the prior art circuit, the time it takes to sense and amplify the bitlines for high data (T1) and low data (T3) are about 6.2 and 8.4 nanoseconds, respectively. In contrast, in a memory device according to the present invention, the time required to sense and amplify high data (T2) and low data (T4) are about 1.0 and 1.1 nanoseconds respectively. Thus, the present invention achieves high speed performance in a semiconductor memory device that operates at a low power supply voltage level. This increase in the speed of the sensing operation is achieved without increasing the stress on the device due to excessive voltage levels during the access operation.

Having described and illustrated the principles of the invention in a preferred embodiment thereof, it should be apparent that the invention can be modified in arrangement and detail without departing from such principles. I claim all modifications and variations coming within the spirit and scope of the following claims.

We claim:

1. A semiconductor memory device comprising:
   a memory cell having a plate node; and
   a plate voltage generator coupled to the plate node, the plate voltage generator generating a first voltage signal at the plate node during a precharge operation and a second voltage signal at the plate node during an access operation and before a sensing operation.

2. A memory device according to claim 1 wherein the plate voltage generator includes:
   a first voltage generator that generates the first voltage level;
   a second voltage generator that generates the second voltage level;
   a first switch coupled between the plate node and the first voltage generator; and
   a second switch coupled between the plate node and the second voltage generator.

3. A memory device according to claim 2 wherein the plate voltage generator further includes a pulse generator coupled to the first and second switches, the pulse generator generating a pulse signal for controlling the switches responsive to a control signal.

4. A memory device according to claim 3 wherein the plate voltage generator further includes an inverter coupled between the pulse generator and the second switch.

5. A memory device according to claim 2 wherein the second voltage generator is a power supply node.

6. A memory device according to claim 2 wherein the first switch is a transistor having a source coupled to a power supply node and a drain coupled to the plate node.

7. A memory device according to claim 2 wherein the second switch is a transistor having a source coupled to a the first voltage generator and a drain coupled to the plate node.

8. A memory device according to claim 3 wherein the pulse generator includes:

a NOR gate having an output port coupled to the first and second switches, a first input port coupled to a control node for receiving the control signal, and a second input port; and a first inverter having an input port coupled to the control node, and an output port coupled to the second input port of the NOR gate.

9. A memory device according to claim 8 wherein the pulse generator further includes:

a second inverter having an input port coupled to the output port of the first inverter; and a third inverter having an input port coupled to the output port of the second inverter, and an output port coupled to the second input port of the NOR gate.

10. A memory device according to claim 9 wherein the pulse generator further includes:

a fourth inverter having an input port coupled to the output port of the third inverter; and a fifth inverter having an input port coupled to the output port of the fourth inverter, and an output port coupled to the second input port of the NOR gate.

11. A memory device according to claim 1 wherein the plate voltage generator includes:

a first voltage generator having an output node;

a first transistor having a source coupled to a power supply node, a drain coupled to the plate node and a gate;

a second transistor having a source coupled to the output node of the first voltage generator, a drain coupled to the plate node, and a gate;

an inverter having an output port coupled to gate of the first transistor and an input port coupled to the gate of the second transistor; and a pulse generator having an output port coupled to the gate of the second transistor.

12. A memory device according to claim 11 wherein the pulse generator includes:

a NOR gate having an output port which forms the output port of the pulse generator, a first input port coupled to a control node, and a second input port; and a first inverter having an input port coupled to the control node, and an output port coupled to the second input port of the NOR gate.

13. A semiconductor memory device comprising:

a memory cell having a plate node;

means for generating a first voltage signal;

means for generating a second voltage signal;

first switching means for coupling the plate node to the first voltage generator during a precharge operation; and second switching means for coupling the plate node to the second voltage generator during an access operation and before a sensing operation.

14. A semiconductor memory device according to claim 13 further including means for generating a pulse signal for controlling the first and second switching means responsive to the control signal.

15. A method for sensing the logic level of a semiconductor memory cell having a bit line, a plate node, a storage node, and a capacitor coupled between the plate node and the storage node, the method comprising:

charging the bit line to a precharge voltage level;

charging the plate node to a first voltage level;

charging the plate node to a second voltage level, thereby boosting the voltage level at the storage node;

coupling the storage node to the bit line, thereby redistributing charge from the capacitor between the capacitor and the bit line; and sensing the voltage level of the bit line after charging the plate node to the second voltage level.

16. A method according to claim 15 wherein charging the plate node to the first voltage level includes coupling the plate node to a first voltage generator.

17. A method according to claim 15 wherein charging the plate node to the second voltage level includes coupling the plate node to a second voltage generator.

18. A method according to claim 17 wherein coupling the plate node to the second voltage generator includes:

generating a control signal;

generating a pulse signal responsive to the control signal; and coupling the plate node to the second voltage generator responsive to the pulse signal.

19. A method according to claim 15 wherein the second voltage level is substantially equal to the precharge voltage level.

20. A method according to claim 15 wherein, after the plate node is charge to the second voltage level and before the storage node is coupled to the bit line, the magnitude of the voltage difference between the storage node and the bit line is substantially the same when the data stored in the memory cell is a high logic level as when the data stored in the memory cell is a low logic level.

21. A method according to claim 19 wherein the second voltage level and the precharge voltage level are substantially equal to a power supply voltage level.

* * * * *